(12) United States Patent
Kang

(10) Patent No.: US 7,539,072 B2
(45) Date of Patent: May 26, 2009

(54) SEMICONDUCTOR MEMORY DEVICE

(75) Inventor: Khil-Ohk Kang, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 85 days.

(21) Appl. No.: 11/647,707

(22) Filed: Dec. 29, 2006

(65) Prior Publication Data

US 2008/0002482 A1 Jan. 3, 2008

(30) Foreign Application Priority Data

Jun. 29, 2006 (KR) .................. 10-2006-0059263

(51) Int. Cl.
*G11C 7/00* (2006.01)
*G11C 8/00* (2006.01)

(52) U.S. Cl. .............. 365/201; 365/226; 365/189.07; 365/189.09

(58) Field of Classification Search .......... 365/201, 365/226, 189.07, 189.09
See application file for complete search history.

(56) References Cited

U.S. PATENT DOCUMENTS

| 5,249,155 | A | * | 9/1993 | Arimoto et al. | ............ 365/201 |
|---|---|---|---|---|---|
| 6,014,336 | A | * | 1/2000 | Powell et al. | ............ 365/201 |
| 6,038,181 | A | * | 3/2000 | Braceras et al. | ............ 365/201 |
| 6,059,450 | A | * | 5/2000 | McClure | ............ 365/201 |
| 6,288,965 | B1 | * | 9/2001 | Hara et al. | ............ 365/201 |
| 6,292,415 | B1 | * | 9/2001 | Brehm | ............ 365/201 |
| 6,885,599 | B2 | * | 4/2005 | Saitoh et al. | ............ 365/201 |
| 6,950,358 | B2 | * | 9/2005 | Lindstedt | ............ 365/201 |
| 7,120,071 | B2 | * | 10/2006 | An | ............ 365/201 |

FOREIGN PATENT DOCUMENTS

| KR | 1999-006207 | 1/1999 |
|---|---|---|
| KR | 2003-0032680 | 4/2003 |
| KR | 10-2004-0011835 | 2/2004 |
| KR | 10-2004-0108017 | 12/2004 |
| KR | 10-2005-0011453 | 1/2005 |

* cited by examiner

*Primary Examiner*—Trong Phan
(74) *Attorney, Agent, or Firm*—Blakely, Sokoloff, Taylor & Zafman LLP

(57) ABSTRACT

A semiconductor memory device generates an internal voltage by using one detecting circuit at the burn-in and normal modes. The semiconductor memory device includes a burn-in adjusting circuit to produce a burn-in mode test signal, a first reference voltage generating circuit to produce a first reference voltage for a burn-in test in response to the burn-in mode test signal, a second reference voltage generating circuit to produce a second reference voltage for a normal mode, a detecting circuit for detecting voltage levels of the first and second reference voltages and outputting a detection signal and an internal voltage generating circuit for generating an internal voltage in response to the detection signal.

20 Claims, 8 Drawing Sheets

SEMICONDUCTOR MEMORY DEVICE

CROSS-REFERENCE TO RELATED APPLICATIONS

The present invention claims priority of Korean patent application number 10-2006-0059263, filed on Jun. 29, 2006, which is incorporated by reference in its entirety.

BACKGROUND OF THE INVENTION

The present invention relates to a semiconductor memory device, and more particularly to a semiconductor memory device capable of stably providing an internal voltage.

Generally, semiconductor memory devices store a plurality of data and provide the stored data when the data are required to be read out. The basic operation of the semiconductor memory device is a write operation to store data in determined cells and a read operation to output the stored data. It is necessary to have different levels of an internal voltage in order to perform the read and write operations effectively. In order to perform the read and write operations of the semiconductor memory device, there are needed a core voltage used for a data storage area in which a plurality of data are stored and a peripheral voltage used for a peripheral area in which data input and output operations are carried out. DRAM of the semiconductor memory devices, which has been most widely used, comprises a unit cell for storing one data with one MOS transistor and one capacitor. In order to turn on the MOS transistor of the unit cell, the semiconductor memory device uses a high voltage which is higher than the core voltage by a predetermined voltage level and a bulk voltage which is lower than a ground voltage by a predetermined voltage level.

The semiconductor memory device produces various internal voltages, for example, the core voltage, the high voltage, the bulk voltage and the like, to access the data based on a power supply voltage and a ground voltage supplied from an external circuit. To produce these internal voltages, the semiconductor memory device includes an internal voltage generating circuit and a detection circuit to decide whether a voltage level from the internal voltage generating circuit is kept in a predetermined voltage level.

On the other hand, after the semiconductor memory devices are manufactured, they are checked out through the various tests to decide whether the manufactured memory devices carry out a stable operation. At this time, one of the various tests is a burn-in mode test. The burn-in mode test is to detect a potentially erroneous unit cell at its early stage by applying a high voltage, which is higher than a voltage of the normal operation, to the semiconductor memory device and by making this semiconductor memory device operate at a high temperature. In the process where the semiconductor memory devices are manufactured, if there are minute defects in a part of a plurality of unit cells, they will be in a latent failure which does not appear at the moment. To detect the latent failure of the unit cell at its early stage, the burn-in mode test to operate the memory device in the burn-in environment, which is more severe than the normal environment, is carried out.

Accordingly, the semiconductor memory device should generate a different internal voltage level, which differs from a voltage level required to access the data in the normal mode, at the time of the burn-in mode test. Therefore, the semiconductor memory devices have to additionally include a burn-in mode internal voltage generating circuit for the burn-in mode test, independent of the normal mode internal voltage generating circuit. An area of the circuit, which is additionally equipped for the burn-in test, is critical to reduce the total area of the semiconductor memory device.

SUMMARY OF THE INVENTION

Embodiments of the present invention are directed to provide a semiconductor memory device capable of effectively providing an internal voltage in a burn-in mode as well as in a normal mode.

In accordance with an aspect of the present invention, there is provided a semiconductor memory device comprising: a burn-in adjusting circuit for producing a burn-in mode test signal; a first reference voltage generating circuit for producing a first reference voltage for a burn-in test in response to the burn-in mode test signal; a second reference voltage generating circuit for producing a second reference voltage for a normal mode; a detecting circuit for detecting voltage levels of the first and second reference voltages and for outputting a detection signal; and an internal voltage generating circuit for generating an internal voltage in response to the detection signal from the detecting circuit.

In accordance with another aspect of the present invention, there is provided a method for driving a semiconductor memory device comprising the steps of: providing a first reference voltage corresponding to a burn-in mode; detecting a voltage level of the first reference voltage using a detecting circuit; producing a first internal voltage for a burn-in test in response to the first reference voltage; providing a second reference voltage for a normal mode; detecting a voltage level of the second reference voltage using the detecting circuit; and producing a second internal voltage for the burn-in test in response to the second reference voltage.

In accordance with a further aspect of the present invention, there is provided a semiconductor memory device comprising: a reference voltage generating circuit for producing a first reference voltage or a second reference voltage; a detecting circuit for detecting a first voltage level of the first reference voltage in a burn-in mode and for detecting a second voltage level of the second reference voltage in a normal mode; and an internal voltage generating circuit for producing an internal voltage in response to a detection signal from the detecting circuit.

In accordance with a still further aspect of the present invention, there is provided a semiconductor memory device comprising: a reference voltage generating circuit for producing a first reference voltage or a second reference voltage; a detecting circuit for receiving a first power supply voltage and detecting a first voltage level of the first reference voltage in a burn-in mode and for receiving a second power supply voltage and detecting a second voltage level of the second reference voltage in a normal mode; a voltage level controlling unit for, in the burn-in mode, modifying the first voltage level of the first reference voltage into the second voltage level of the second reference voltage and providing the modified voltage level for the detecting circuit; and an internal voltage generating circuit for producing an internal voltage in response to a detection signal from the detecting circuit.

DESCRIPTION OF SPECIFIC EMBODIMENTS

Embodiments of the present invention are directed to provide a semiconductor memory device capable of effectively providing an internal voltage in a burn-in mode as well as in a normal mode.

Figure 1:
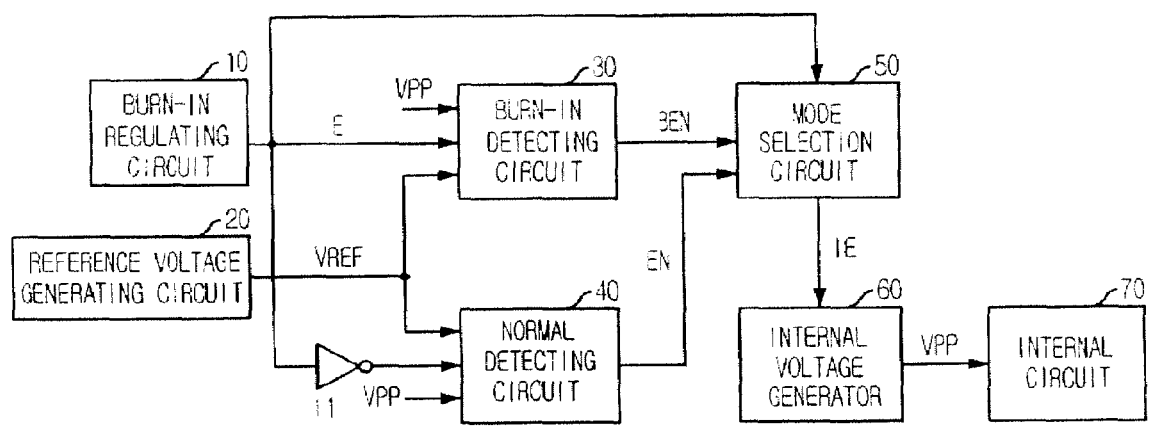
FIG. 1 illustrates a block diagram of a semiconductor memory device according to one embodiment of the present invention.

FIG. 1 provides a block diagram of a semiconductor memory device according to one specific embodiment of the present invention.

The semiconductor memory device includes a burn-in regulating circuit 10, a reference voltage generating circuit 20, a burn-in detecting circuit 30 for a burn-in mode, a normal detecting circuit 40 for a normal mode, a mode selection circuit 50, an internal voltage generator 60, an internal circuit 70 and an inverter I1.

The burn-in regulating circuit 10 is a circuit for providing a burn-in enable signal E to activate the burn-in mode. The reference voltage generating circuit 20 is a circuit to output a reference voltage VREF to set up a reference of an output level of an internal voltage VPP. The burn-in detecting circuit 30 is activated in response to the enable signal E and outputs a burn-in reference signal BEN in response to the reference voltage VREF. The normal detecting circuit 40 is a circuit which is activated by an inverted signal of the enable signal E and which outputs a reference signal EN for a normal mode in response to the reference voltage VREF. The mode selection circuit 50 selectively provides the burn-in reference signal BEN or the normal mode reference signal EN to the internal voltage generator 60 in response to the enable signal E. The internal voltage generator 60 produces the internal voltage VPP in response to an internal voltage generating signal IE outputted from the mode selection circuit 50. The internal voltage generator 60 produces the internal voltage VPP and provides it to the internal circuit 70. The internal circuit 70 can be one of various circuits using the internal voltage of the semiconductor memory device. Moreover, the burn-in detecting circuit 30 and the normal detecting circuit 40 are always enabled selectively by inputting the enable signal E of different logic levels into the burn-in detecting circuit 30 and the normal detecting circuit 40.

If the burn-in regulating circuit 10 produces the enable signal E at the time of the burn-in mode test, an activated enable signal E is provided for the burn-in detecting circuit 30 and an inverted enable signal E is provided for the normal detecting circuit 40. Therefore, the burn-in detecting circuit 30 is enabled and the normal detecting circuit 40 is disabled. The enable signal E is provided to the mode selection circuit 50 and the mode selection circuit 50 outputs the internal voltage generating signal IE to the internal voltage generator 60 in response to the burn-in reference signal BEN from the burn-in detecting circuit 30. The reference voltage generating circuit 20 provides the reference voltage VREF for the burn-in detecting circuit 30 and the normal detecting circuit 40, respectively.

The burn-in detecting circuit 30 outputs the burn-in reference signal BEN in response to the reference voltage VREF. The mode selection circuit 50 outputs the internal voltage generating signal IE corresponding to the burn-in reference signal BEN to the internal voltage generator 60. The internal voltage generator 60 produces the internal voltage VPP in response to the internal voltage generating signal IE and provides the produced internal voltage VPP to the internal circuit 70.

Subsequently, in the normal mode, the enable signal E is not activated so that the burn-in detecting circuit 30 is inactivated and the normal detecting circuit 40 is activated. The reference voltage generating circuit 20 provides the reference voltage VREF for the burn-in detecting circuit 30 and the normal detecting circuit 40. At the time of the normal operation, the normal detecting circuit 40 provides the normal reference signal EN for the normal operation to the mode selection circuit 50. The mode selection circuit 50 outputs to the internal voltage generator 60 the internal voltage generating signal IE corresponding to the normal reference signal EN. The internal voltage generator 60 produces the internal voltage VPP in response to the internal voltage generating signal IE and provides the produced internal voltage VPP to the internal circuit 70.

The internal voltage VPP can have one of various voltage levels which are used in the semiconductor memory devices. For example, the internal voltage can be a core voltage used in a core area, a peripheral driving voltage used in a peripheral area, or a high or low voltage to turn on or off MOS transistors. The high voltage has a higher voltage level than a power supply voltage inputted to the semiconductor memory device and the low voltage has a lower voltage level than a ground voltage inputted to the semiconductor memory device. The low voltage has been widely used as a bulk voltage of MOS transistors.

Figure 2:
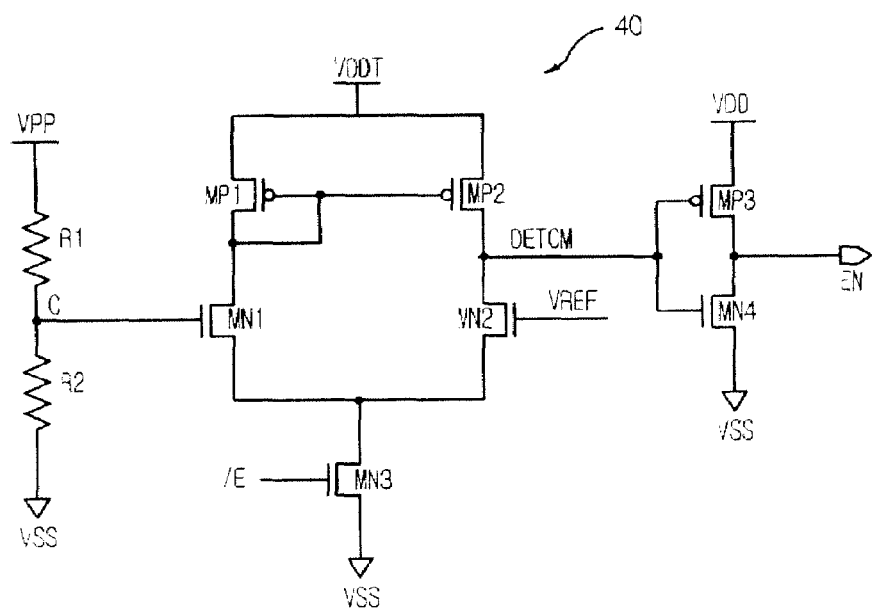
FIG. 2 shows a circuit diagram of a normal detecting circuit of FIG. 1.

FIG. 2 shows a circuit diagram of the normal detecting circuit 40 of FIG. 1.

The normal detecting circuit 40 includes resistors R1 and R2 for dividing an internal voltage VPP generated from the internal voltage generator 60 into two divided voltage levels, MOS transistors MP1, MP2, MN1, MN2 and MN3 for a comparator to compare a comparison voltage at a node C divided by the resistors R1 and R2 with the reference signal VREF, and the MOS transistors MP3 and MN4 for inverting an output signal from the comparator and for outputting the inverted signal as the normal reference signal EN. Here, MP1 and MP2 receive power supply voltage for test VDDT through source and MN3 receives/E, an inverted signal of E, through gate. Meanwhile, the inner configuration of the burn-in detecting circuit 30 is substantially the same as that of the normal detecting circuit 40 and the outputted signal of the burn-in detecting circuit 30 is used as the burn-in reference signal BEN.

When the voltage level of the internal voltage VPP is higher than a predetermined voltage level, the normal detecting circuit 40 outputs the normal reference signal EN in a low level so that the internal voltage generator 60 is not operated. When the voltage level of the internal voltage VPP is lower than a predetermined voltage level, the normal reference signal EN is enabled in a high level so that the internal voltage generator 60 is operated. Also, the burn-in detecting circuit 30 executes, in the burn-in mode, the same operation which is mentioned in the normal detecting circuit 40.

In case where the internal voltage VPP is kept over a predetermined level, the comparison voltage at the node C which is divided by the resistors R1 and R2 is higher than the reference voltage VERF. Accordingly, the MOS transistor MN1 of the two MOS transistors MN1 and MN2 is strongly turned on as compared with the MOS transistor MN2. The same amount of current is supplied to the MOS transistors MN1 and MN2 by the MOS transistors MP1 and MP2 which form a current mirror. As a result, the MOS transistor MN1, which is strongly turned on, induces much more current than the MOS transistor MN2. Since a sufficient current does not flow on the MOS transistor MN2, the current flowing through the MOS transistor MP2 increases the voltage level at a node DETCM. As the voltage level at the node DETCM rises, the normal reference signal EN, which is outputted finally from the normal detecting circuit 40, is maintained in a non-active mode.

In case where the internal voltage VPP is maintained below a predetermined voltage level, the comparison voltage at the node C, which is divided by the resistors R1 and R2, is lower than the reference voltage VREF. Accordingly, the MOS transistor MN2 of the two MOS transistors MN1 and MN2 is strongly turned on as compared with the MOS transistor MN1. The same amount of current is supplied to the MOS transistors MN1 and MN2 by the MOS transistors MP1 and MP2 which form a current mirror. As a result, the MOS transistor MN2, which is strongly turned on, induces much more current than the MOS transistor MN1. Since sufficient current flows through the MOS transistor MN2, the voltage level at the node DETCM is continuously dropped. As the voltage level of the node DETCM falls down, the normal reference signal EN, which is outputted finally from the normal detecting circuit 40, is enabled in a high level.

Figure 3:
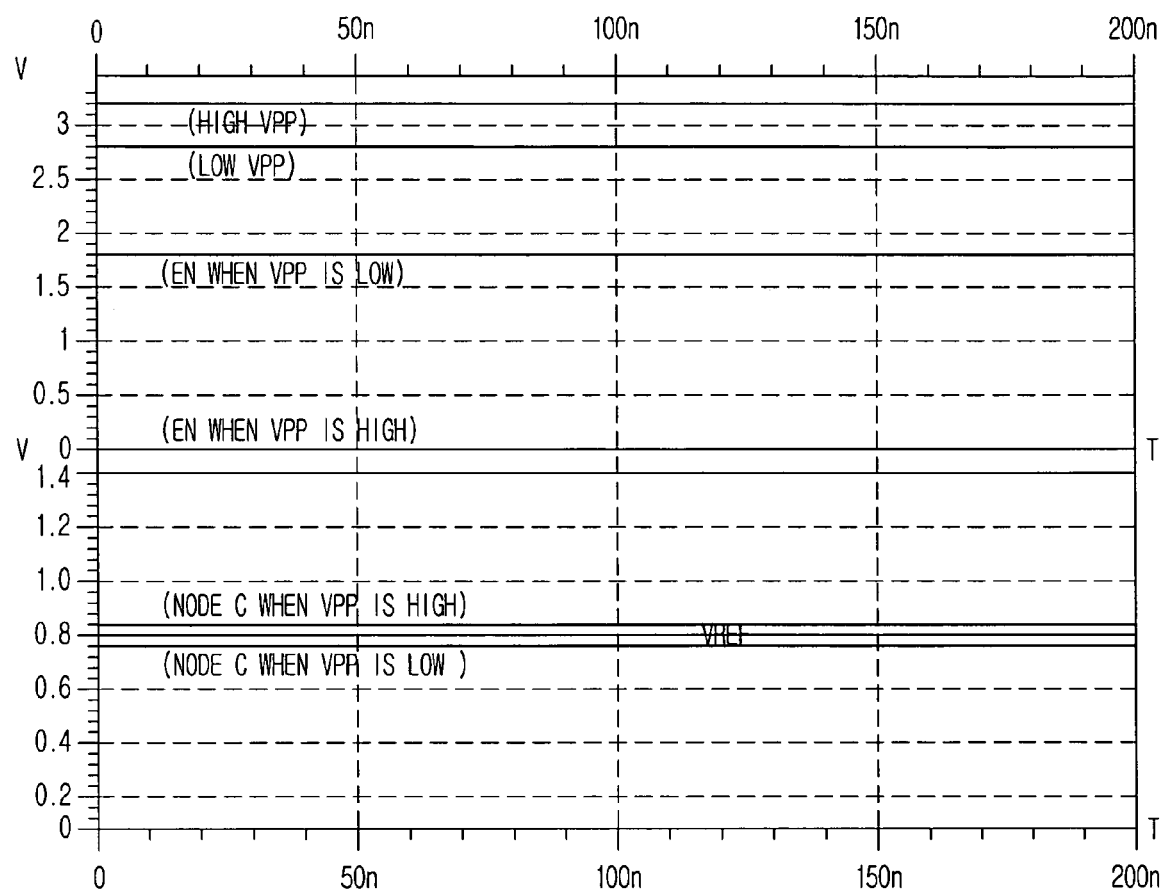
FIG. 3 is a waveform illustrating an operation of the normal detecting circuit of FIG. 2.

FIG. 3 is a waveform illustrating the operation of the normal detecting circuit of FIG. 2.

Referring to FIG. 3, when the voltage level of the power supply voltage VDD is 1.8V and a target voltage of the internal voltage VPP is 3.0V, the simulation results show the actual internal voltages VPP is 3.2V and 2.8V respectively. A voltage of node C in FIG. 2 is higher than the reference voltage VREF when the internal voltage VPP is 3.2V, and lower than the reference voltage VREF when the internal voltage VPP is 2.8V. The normal reference signal EN is high and low level when the internal voltage VPP is 2.8V and 3.2V respectively.

Figure 4:
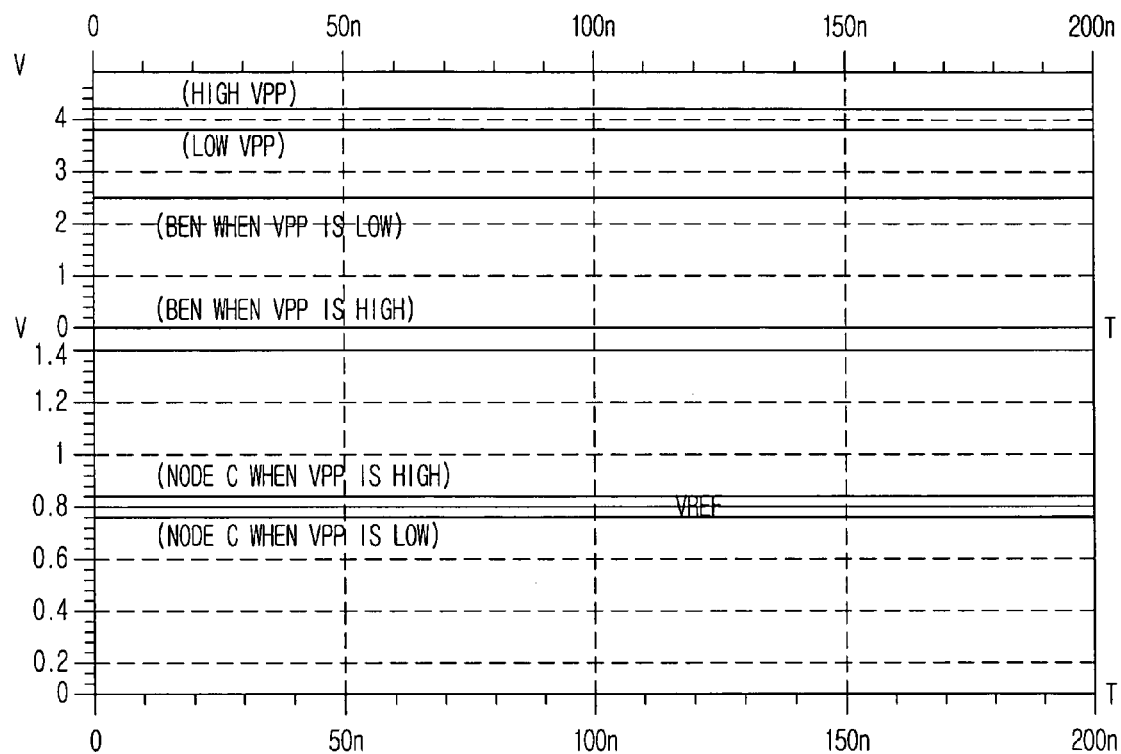
FIG. 4 is a waveform illustrating an operation of a burn-in detecting circuit of FIG. 1.

FIG. 4 is a waveform illustrating the operation of the burn-in detecting circuit of FIG. 1.

In FIG. 4, when the voltage level of the power supply voltage VDD is 2.5V and a target voltage of the internal voltage VPP is 4.0V, the simulation results show the actual internal voltages VPP is 3.8V and 4.2V. At this time, the reference voltage VREF, which is inputted into the normal detecting circuit 30 and the burn-in detecting circuit 40, is kept at 0.8V. A voltage of node C in FIG. 2 is higher than the reference voltage VREF when the internal voltage VPP is 4.2V, and lower than the reference voltage VREF when the internal voltage VPP is 3.8V. The burn-in reference signal BEN is high and low level when the internal voltage VPP is 3.8V and 4.2V respectively.

As mentioned above, since the reference voltage VREF which is inputted into the normal detecting circuit 40 and the burn-in detecting circuit 30 has the same level, the resistors to supply the comparison voltage should have different resistance values from each other. For example, the resistors R1 and R2 in the normal detecting circuit 40 have to divide the internal voltage of 3.0V and the resistors R1 and R2 in the burn-in detecting circuit 30 have to divide the internal voltage of 4.0V. Due to this voltage magnitude, the resistors should be differently disposed based on the normal detecting circuit 40 and the burn-in detecting circuit 30. The sizes of the MOS transistors also should be differently disposed based on the normal detecting circuit 40 and the burn-in detecting circuit 30. In order to reduce the current consumption, the resistors in the normal detecting circuit 40 and the burn-in detecting circuit 30 have to be designed to have large resistance. However, when this requirement is satisfied, there is a problem that the circuit size of the semiconductor memory device is increased. In order to solve the problem, in another embodiment of the present invention, one detecting circuit plays the role of not only the normal detecting circuit but also the burn-in detecting circuit. When a detected voltage level is changed, the semiconductor memory device according to another embodiment of the present invention adjusts the detecting level of the detecting circuit.

Figure 5:
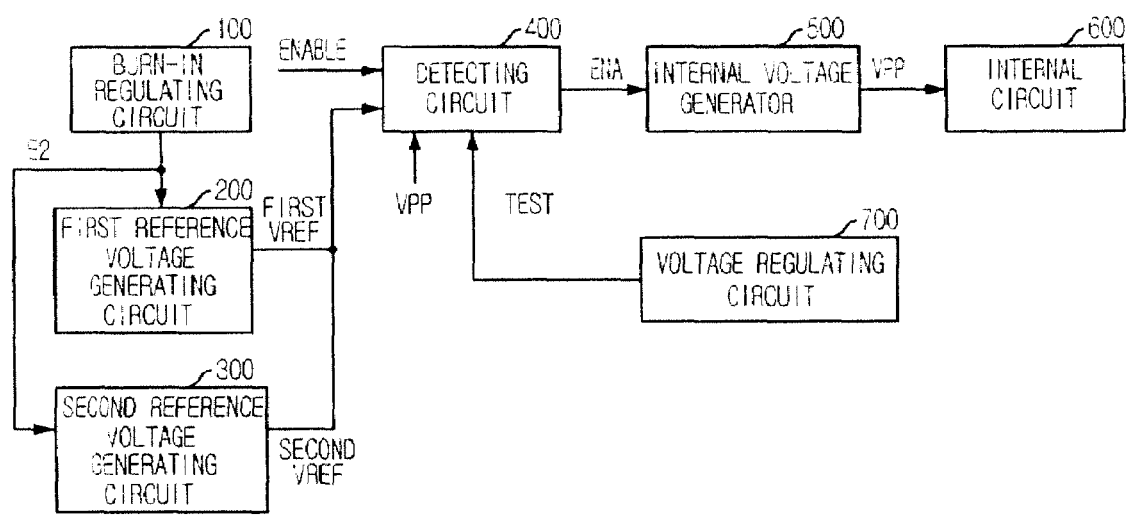
FIG. 5 provides a block diagram of a semiconductor memory device according to another embodiment of the present invention.

FIG. 5 illustrates a block diagram of a semiconductor memory device according to another specific embodiment of the present invention.

The semiconductor memory device includes a burn-in regulating circuit 100, a first reference voltage generating circuit 200, a second reference voltage generating circuit 300, a detecting circuit 400, an internal voltage generator 500, an internal circuit 600, and a voltage regulating circuit 700.

The burn-in regulating circuit 100 produces a burn-in mode signal E2 to activate the burn-in mode. The first reference voltage generating circuit 200 in the burn-in mode provides a first reference voltage VREF to the detecting circuit 400 in response to a first level of the burn-inmode signal E2. The second reference voltage generating circuit 300 in the normal mode provides a second reference voltage VREF to the detecting circuit 400 and the second reference voltage generating circuit 300 is activated in response to a second level of the burn-in mode signal E2. Further, the first and second reference voltage generating circuits 200 and 300 are selectively activated and the first and second reference voltages, which are inputted into the detecting circuit 400, are produced on the same node (reference node) by the first and second reference voltage generating circuits 200 and 300. The detecting circuit 400 provides an internal voltage generating signal ENA for the internal voltage generator 500 based on the reference voltage VREF. The internal voltage generator 500 produces an internal voltage VPP in response to the internal voltage generating signal ENA and provides the produced internal voltage to the internal circuit 600. The voltage regulating circuit 700 outputs a control signal TEST to the detecting circuit 400 in order to adjust the voltage level to be detected by the detecting circuit 400.

The burn-in regulating circuit 100 produces and outputs the burn-in mode signal E2 in the burn-in mode. The first reference voltage generating circuit 200 is activated by the burn-in mode signal E2 and produces the first reference voltage VREF which is outputted to the detecting circuit 400. The first reference voltage VREF is used as a signal to maintain the voltage level for the burn-in mode. The second reference voltage generating circuit 300 is activated in the normal mode and produces the second reference voltage VREF for the normal mode so that the produced second reference voltage VREF is provided for the detecting circuit 400. The detecting circuit 400 in the normal mode outputs the internal voltage generating signal ENA based on the second reference voltage VREF provided from the second reference voltage generating circuit 300 and the detecting circuit 400 in the burn-in mode outputs the internal voltage generating signal ENA based on the first reference voltage VREF provided from the first reference voltage generating circuit 200. The detecting circuit 400 detects different voltage levels in the burn-in mode and the normal mode, and these different voltage detecting operations are carried out by the control signal TEST from the voltage regulating circuit 700. The internal voltage generating circuit 500 produces the internal voltage VPP in response to the internal voltage generating signal ENA and provides the produced voltage for the internal circuit 600. Since the first reference voltage is used for the burn-in mode, the voltage level of the first reference voltage is preferably higher than that of the second reference voltage; however, it is possible to modify the configuration to the contrary.

The internal voltage VPP can have one of various voltage levels which are used in the semiconductor memory devices. For example, the internal voltage can be a core voltage used in a core area, a peripheral driving voltage used in a peripheral area, or a high or low voltage to turn on or off MOS transistors. The high voltage has a higher level than a power supply voltage inputted to the semiconductor memory device and the low voltage has a lower level than a ground voltage inputted to the semiconductor memory device. The low voltage has been widely used as a bulk voltage of MOS transistors.

Figure 6:
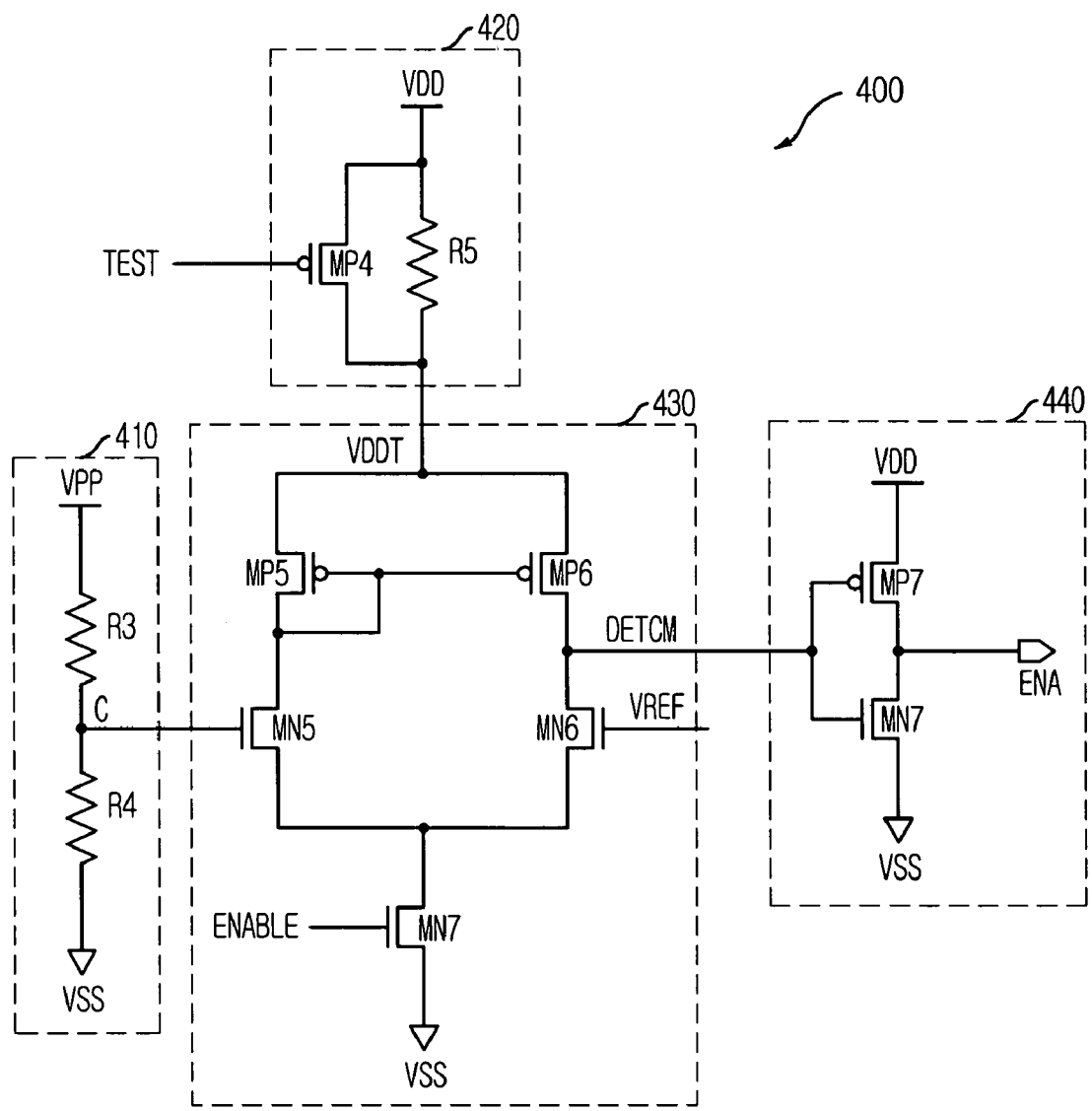
FIG. 6 presents a circuit diagram of a detecting circuit of FIG. 5.

FIG. 6 describes a circuit diagram of the detecting circuit of FIG. 5.

The detecting circuit 400 includes a voltage divider 410 to divide a voltage level of the internal voltage VPP and to output a comparison voltage through a node C, a comparison unit 430 to compare the comparison voltage with the reference voltage VREF provided through a reference node, a voltage level controlling unit 420 to control an operation voltage level of the comparison unit 430, and an output unit 440 to output the internal voltage generating signal ENA based on the result of the comparison unit 430.

The voltage divider 410 includes two serially connected resistors R3 and R4. The internal voltage VPP is applied to one terminal of the resistor R3 and a ground voltage is applied to one terminal of the resistor R4. The comparison voltage is produced on the common node C between the two resistors R3 and R4. The voltage level divided by the voltage divider 410 is set up in consideration of the ratio of the voltage level of the internal voltage VPP to the reference voltage VREF at the same time in the normal mode and also in consideration of the ratio of the voltage level of the internal voltage VPP to the reference voltage VREF at the same time in the burn-in mode.

The comparison unit 430 includes MOS transistor MP5 and MP6 to form a current mirror, a MOS transistor MN5 which is coupled to the MOS transistor MP5 and has a gate to which the comparison voltage at the node C is applied, a MOS transistor MN6 having a gate to which the reference voltage VREF provided through the reference node is applied and being coupled to the MOS transistor MP6, and a MOS transistor MN7 having a gate to which an enable signal ENABLE is applied and being coupled to the MOS transistors MN5 and MN6 and a ground voltage supplier VSS. Here, MP5 and MP6 receive power supply voltage for test VDDT through source.

The voltage level controlling unit 420 includes a resistor R5 which is arranged between a power supply voltage VDD and the comparison unit 430 and a MOS transistor MP4 which is in parallel coupled to the resistor R5. The control signal TEST is applied to a gate of the MOS transistor MP4. The output unit 440 includes an inverter to invert an output signal of the comparison unit 430 to output the internal voltage generating signal ENA. The inverter includes two MOS transistors MP7 and MN7 serially connected between the power supply voltage VDD and the ground voltage VSS.

First, in the normal mode, the second reference voltage VREF which is outputted from the second reference voltage generating circuit 300 is provided to the detecting circuit 400. At this time, the enable signal ENABLE is inputted in a high level so that the MOS transistor MN7 is turned on. The control signal TEST which is outputted from the voltage regulating circuit 700 is inputted in a low level and the MOS transistor MP4 is turned on.

In case where the internal voltage VPP outputted from the internal voltage generator 500 is kept in a predetermined voltage level, the comparison voltage outputted from the voltage divider 410 is relatively higher than the reference voltage VREF. Therefore, the MOS transistor MN5 of the two MOS transistors MN5 and MN6 is relatively and strongly turned on. The same amount of current is supplied to the MOS transistors MN5 and MN6 by the MOS transistors MP5 and MP6 which form a current mirror. As a result, the MOS transistor MN5, which is strongly turned on, induces much more current than the MOS transistor MN6. Since the MOS transistor MN6 does not flow the current sufficiently, the current which flows through the MOS transistor MP6 increases the voltage level at a node DETCM. As the voltage level at the node DETCM increases, the internal voltage generating signal ENA outputted finally from the detecting circuit 400 is disabled in a low level.

In case where the internal voltage VPP is maintained below a predetermined voltage level, the comparison voltage at the node C, which is outputted from the voltage divider 410, is lower than the reference voltage VERF. Accordingly, the MOS transistor MN6 is strongly turned on as compared with the MOS transistor MN5. The same amount of current is supplied to the MOS transistors MN5 and MN6 by the MOS transistors MP5 and MP6 which form a current mirror. Therefore, the MOS transistor MN6, which is strongly turned on, induces much more current than the MOS transistor MN5. Since sufficient current flows through the MOS transistor MN6, the voltage level at the node DETCM is continuously dropped. As the voltage level of the node DETCM falls down, the internal voltage generating signal ENA, which is outputted finally from the detecting circuit 400, is enabled in a high level.

To illustrate the burn-in mode, assume that the target level of the internal voltage VPP is 4V, the power supply voltage VDD is 2.5V, and the reference voltage is 1.07V. In case of the normal mode, the reference voltage is 0.8V and the power supply voltage is 1.8V. In the burn-in mode, the burn-in mode signal E2 is enabled and the first reference voltage generating circuit 200 outputs the first reference voltage VREF. The enable signal ENABLE is inputted in a high level into the MOS transistor MN7 so that the MOS transistor MN7 is turned on. The control signal TEST is inputted in a high level into the MOS transistor MP4 so that the MOS transistor MP4 is turned off. Accordingly, in the burn-in mode, an original external voltage is not directly applied to the comparison unit 430, but a voltage signal which is dropped by the resistor R5 is applied to the comparison unit 430.

In case where the internal voltage VPP from the internal voltage generating circuit 500 is kept over a predetermined level, the comparison voltage at the node C which is outputted from the voltage divider 410 is relatively higher than the reference voltage VREF. Accordingly, the MOS transistor MN5 of the two MOS transistors MN5 and MN6 is strongly turned on as compared with the MOS transistor MN6. The same amount of current is supplied to the two MOS transistors MN5 and MN6 due to the current mirror of the MOS transistors MP5 and MP6.

It should be noted that the power supply voltage provided from the power supply voltage terminal VDD in the burn-in mode is higher than the power supply voltage provided in the normal mode. In this case, the power supply voltage is 2.5V which is higher than 1.8V. However, due to the resistance of the voltage level controlling unit 420, although the voltage level provided from the external circuit in the burn-in mode is higher than that in the normal mode, the voltage level of the driving voltage which is applied to the comparison unit 430 in the burn-in mode can be the same as that in the normal mode. It is possible to adjust the voltage level of the driving voltage provided to the comparison unit if the resistance value of the resistor R5 is controlled.

The current which flows on the MOS transistor MN5 which is turned on much more is larger than that on the MOS transistor MN6 which is slightly turned on. Since the sufficient current does not flow in the MOS transistor MN6, the current flowing through the MOS transistor MP6 increases the voltage level at the node DETCM. As the voltage level of the node DETCM increases, the internal voltage generating signal ENA outputted finally from the detecting circuit 400 is maintained at a non-activated state in a low level.

In case where the internal voltage VPP goes down to a predetermined voltage level, the comparison voltage at the node C which is divided by the voltage divider 410 is lower than the reference voltage VREF. Accordingly, the MOS transistor MN6 of the two MOS transistors MN5 and MN6 is strongly turned on as compared with the MOS transistor MN5. The same amount of current is supplied to the MOS transistors MN5 and MN6 by the MOS transistors MP5 and MP6 which form a current mirror. As a result, the MOS transistor MN6, which is strongly turned on, induces much more current than the MOS transistor MN5. Since sufficient current flows through the MOS transistor MN6, the voltage level at the node DETCM is continuously dropped. As the voltage level of the node DETCM falls down, the internal voltage generating signal ENA, which is outputted finally from the detecting circuit 400, is enabled in a high level. When the internal voltage generating signal ENA is enabled in a high level, the internal voltage generating unit 500 outputs an increased original voltage level of the internal voltage VPP.

Figure 7:
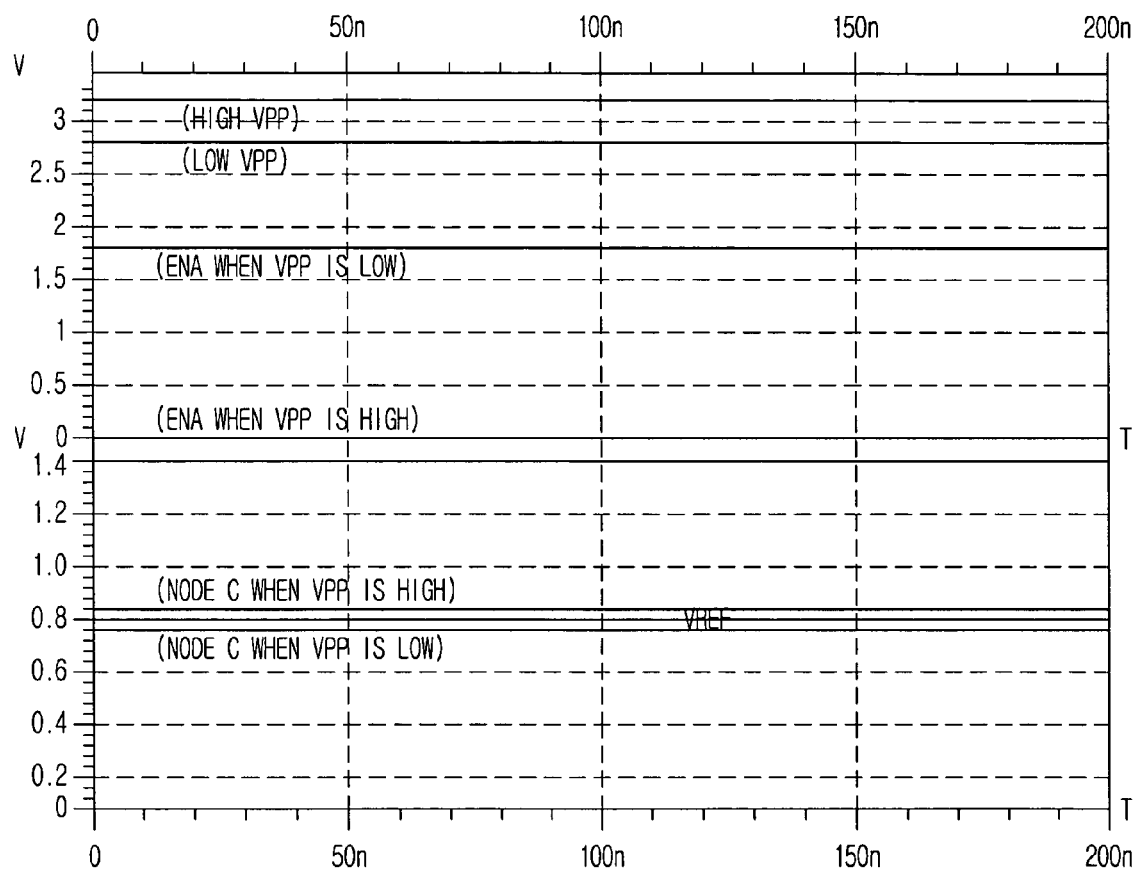
FIG. 7 is a waveform illustrating an operation of the detecting circuit of FIG. 5 in the normal mode.

FIG. 7 is a waveform illustrating the operation of the detecting circuit of FIG. 5 in the normal mode.

Referring to FIG. 7, when the voltage level of the power supply voltage VDD in the normal mode is 1.8V and a target voltage of the internal voltage VPP is 3.0V, the simulation results show the actual internal voltages VPP is 3.2V and 2.8V respectively. A voltage of node C in FIG. 6 is higher than the reference voltage VREF when the internal voltage VPP is 3.2V, and lower than the reference voltage VREF when the internal voltage VPP is 2.8V. The internal voltage generating signal ENA is high and low level when the internal voltage VPP is 2.8V and 3.2V respectively.

Figure 8:
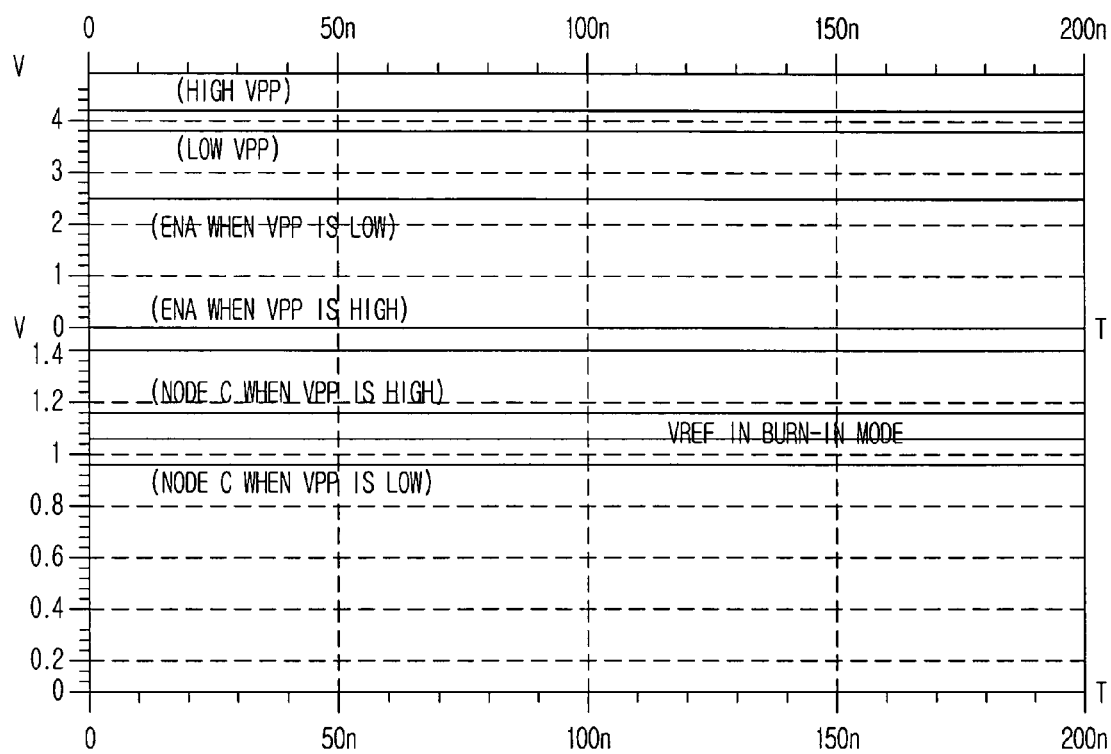
FIGS. 8 and 9 are waveforms illustrating the operation of the detecting circuit of FIG. 5 in the burn-in mode.

FIG. 8 is a waveform illustrating the operation of the detecting circuit in the burn-in mode. The reference voltage VREF inputted into the detecting circuit 400 is maintained at 0.8V in the burn-in mode.

In FIG. 8, when the voltage level of the power supply voltage VDD is 2.5V and a target voltage of the internal voltage VPP is 4.0V, the simulation results show the actual internal voltages VPP is 3.8V and 4.2V respectively. The reference voltage VREF inputted into the detecting circuit 400 is maintained at 1.07V in the burn-in mode. A voltage of node C in FIG. 6 is higher than the reference voltage VREF in the burn-in mode when the internal voltage VPP is 4.2V, and lower than the reference voltage VREF in the burn-in mode when the internal voltage VPP is 3.8V. The internal voltage generating signal ENA is high and low level when the internal voltage VPP is 4.2V and 3.8V respectively.

Figure 9:
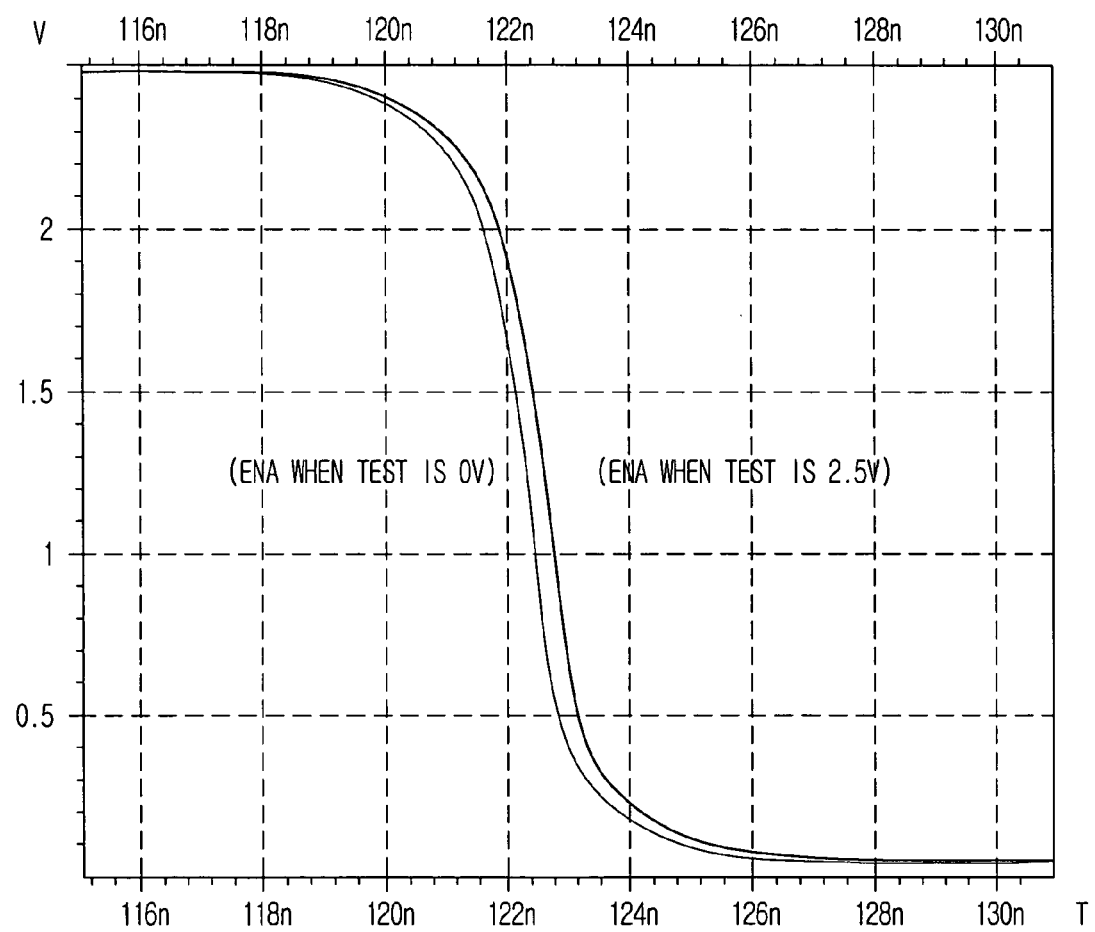

FIG. 9 is a waveform illustrating response time of the detecting circuit 400 in the burn-in mode.

As shown in FIG. 9, the response time of the internal voltage generating signal ENA can be controlled by outputting the control signal TEST in a low, i.e. 0V, or high level, i.e. 2.5V. That is, the voltage level of the driving voltage which is transmitted to the comparison unit 430 can be controlled by controlling the resistance value of the voltage level controlling unit 420 using the control signal TEST and the output timing of the internal voltage generating signal ENA is also adjustable by doing so.

As apparent from the above, according to the present invention, the internal voltage is provided by using one detecting circuit at the burn-in and normal modes. Therefore, the circuit size can be effectively reduced and the reliability of the internal voltage can be achieved at the burn-in mode and normal operation time.

While the present invention has been described with respect to certain preferred embodiments, it will be apparent to those skilled in the art that various changes and modifications may be made without departing from the spirit and scope of the invention as defined in the following claims. For example, the configuration and type of the logic gates and the transistors can be modified and changed.

What is claimed is:

1. A semiconductor memory device, comprising:
   a burn-in adjusting circuit to produce a burn-in mode test signal;
   a first reference voltage generating circuit to produce a first reference voltage for a burn-in test in response to the burn-in mode test signal;
   a second reference voltage generating circuit to produce a second reference voltage for a normal mode;
   a detecting circuit for detecting voltage levels of the first and second reference voltages and outputting a detection signal; and
   an internal voltage generating circuit for generating an internal voltage in response to the detection signal,
   wherein the detecting circuit includes
   a voltage divider for dividing the internal voltage to output a comparison voltage;
   a comparison unit for comparing the comparison voltage with one of the first and second reference voltages provided through a reference node;
   a voltage level controlling unit for controlling a voltage level of a driving voltage which is provided for the comparison unit; and
   an output unit for outputting an internal voltage generating signal in response to an output signal of the comparison unit.

2. The semiconductor memory device of claim 1, wherein the first reference voltage generating circuit is activated in response to the burn-in mode test signal.

3. The semiconductor memory device of claim 2, wherein the first reference voltage is higher than the second reference voltage.

4. The semiconductor memory device of claim 3, further comprising a voltage regulating circuit for controlling the voltage level of the driving voltage which is provided for the detecting circuit.

5. The semiconductor memory device of claim 4, wherein the internal voltage is any one of a bulk voltage, a high voltage and a core voltage.

6. The semiconductor memory device of claim 5, wherein the first reference generating circuit and the second reference generating circuit are selectively activated and the first reference voltage and the second reference voltage are selectively provided through the reference node.

7. The semiconductor memory device of claim 1, wherein the voltage level controlling unit controls the voltage level of the driving voltage according to a voltage of the reference node.

8. The semiconductor memory device of claim 1, wherein the voltage divider includes:
   a first resistor to which the internal voltage is applied; and
   a second resistor to which a ground voltage is applied, being in series coupled to the first resistor,
   wherein the comparison voltage is provided on a common node between the first and second resistors.

9. The semiconductor memory device of claim 1, wherein the comparison unit includes:
   first and second MOS transistors for forming a current mirror;
   a third MOS transistor having a gate to which the comparison voltage is applied, being coupled to the first MOS transistor;
   a fourth MOS transistor having a gate to which the one of the first and second reference voltages is applied, being coupled to the second MOS transistor; and
   a fifth MOS transistor having a gate to which an enable signal is applied, being coupled to the third and fourth MOS transistors and a ground voltage.

10. The semiconductor memory device of claim 1, wherein the voltage level controlling unit includes:
    a resistor disposed between a power supply voltage and the comparison unit; and
    a MOS transistor having a gate to which a control signal from the voltage regulating circuit is applied, being coupled to the resistor in parallel.

11. The semiconductor memory device of claim 1, wherein the output unit includes an inverter for inverting an output signal of the comparison unit to output the internal voltage generating signal.

12. A semiconductor memory device, comprising:
    a reference voltage generating circuit for selectively producing a first reference voltage and a second reference voltage;
    a detecting circuit for detecting a first voltage level of the first reference voltage in a burn-in mode and detecting a second voltage level of the second reference voltage in a normal mode, thereby outputting a detection signal; and
    an internal voltage generating circuit for producing an internal voltage in response to the detection signal from the detecting circuit,
    wherein the detecting circuit includes
    a voltage divider for dividing the internal voltage to output a comparison voltage;
    a comparison unit for comparing the comparison voltage with one of the first and second reference voltages provided through a reference node;
    a voltage level controlling unit for controlling a third voltage level of a driving voltage which is provided for the comparison unit; and
    an output unit for outputting an internal voltage generating signal in response to an output signal of the comparison unit.

13. The semiconductor memory device of claim 12, wherein the first reference voltage is higher than the second reference voltage.

14. The semiconductor memory device of claim 12, further comprising a voltage regulating circuit for controlling the third voltage level of the driving voltage which is provided for the detecting circuit.

15. The semiconductor memory device of claim 12, wherein the internal voltage is any one of a bulk voltage, a high voltage and a core voltage.

16. The semiconductor memory device of claim 12, wherein the voltage level controlling unit controls the third voltage level of the driving voltage according to a voltage of the reference node.

17. The semiconductor memory device of claim 12, wherein the voltage divider includes:
    a first resistor to which the internal voltage is applied; and
    a second resistor to which a ground voltage is applied, being in series coupled to the first resistor, wherein the comparison voltage is provided on a common node between the first and second resistors.

18. The semiconductor memory device of claim 12, wherein the comparison unit includes:
    first and second MOS transistors for forming a current mirror;
    a third MOS transistor having a gate to which the comparison voltage is applied, being coupled to the first MOS transistor;
    a fourth MOS transistor having a gate to which the one of the first and second reference voltages from the reference node is applied, being coupled to the second MOS transistor; and
    a fifth MOS transistor having a gate to which an enable signal is applied, being coupled to the third and fourth MOS transistors and a ground voltage.

19. The semiconductor memory device of claim 12, wherein the voltage level controlling unit includes:
    a resistor disposed between a power supply voltage and the comparison unit; and
    a MOS transistor having a gate to which a control signal from the voltage regulating circuit is applied, being coupled to the resistor in parallel.

20. The semiconductor memory device of claim 12, wherein the output unit includes an inverter for inverting an output signal of the comparison unit to output the internal voltage generating signal.

* * * * *